(12) United States Patent
Yanagawa et al.

(10) Patent No.: US 10,615,076 B2
(45) Date of Patent: Apr. 7, 2020

(54) SEMICONDUCTOR CHIP HAVING ON-CHIP NOISE PROTECTION CIRCUIT

(71) Applicant: HITACHI AUTOMOTIVE SYSTEMS, LTD., Hitachinaka-shi, Ibaraki (JP)

(72) Inventors: Yoshimitsu Yanagawa, Tokyo (JP); Masahiro Matsumoto, Tokyo (JP); Hiroshi Nakano, Tokyo (JP); Akira Kotabe, Hitachinaka (JP); Satoshi Asano, Tokyo (JP)

(73) Assignee: HITACHI AUTOMOTIVE SYSTEMS, LTD., Hitachinaka-Shi, Ibaraki (JP)

( * ) Notice: Subject to any disclaimer, the term of this patent is extended or adjusted under 35 U.S.C. 154(b) by 0 days.

(21) Appl. No.: 15/568,340

(22) PCT Filed: Mar. 25, 2016

(86) PCT No.: PCT/JP2016/059534
§ 371 (c)(1),
(2) Date: Oct. 20, 2017

(87) PCT Pub. No.: WO2016/170913
PCT Pub. Date: Oct. 27, 2016

(65) Prior Publication Data
US 2018/0144984 A1  May 24, 2018

(30) Foreign Application Priority Data
Apr. 23, 2015  (JP) .................. 2015-088034

(51) Int. Cl.
*H01L 21/822* (2006.01)
*H01L 27/02* (2006.01)
(Continued)

(52) U.S. Cl.
CPC ........ *H01L 21/822* (2013.01); *H01L 23/4824* (2013.01); *H01L 27/0288* (2013.01); *H01L 27/04* (2013.01); *H01L 23/60* (2013.01)

(58) Field of Classification Search
None
See application file for complete search history.

(56) References Cited

U.S. PATENT DOCUMENTS 5,019,883 A   5/1991  Mori et al.
5,218,222 A *  6/1993  Roberts ............... H01L 27/0251
                                                  257/362
(Continued)

FOREIGN PATENT DOCUMENTS

JP   S61-032563 A   2/1986
JP   H02-214151 A   8/1990
(Continued)

OTHER PUBLICATIONS

International Search Report and Written Opinion issued in corresponding application No. PCT/JP2016/059534 dated May 31, 2016.
(Continued)

*Primary Examiner* — Herve-Louis Y Assouman
(74) *Attorney, Agent, or Firm* — Foley & Lardner LLP

(57) ABSTRACT

A semiconductor chip having a pad, a protective element, and an internal circuit for providing a semiconductor chip having a protective circuit with high noise resistance, wherein the semiconductor chip is characterized in that the resistance value of metal wiring on a path reaching the pad and the protective element is higher than the resistance value of the protective element.

20 Claims, 15 Drawing Sheets

(51) Int. Cl.
   *H01L 23/482*   (2006.01)
   *H01L 27/04*    (2006.01)
   *H01L 23/60*    (2006.01)

(56) References Cited

U.S. PATENT DOCUMENTS

| | | | |
|---|---|---|---|
| 5,648,676 A * | 7/1997 | Iwai | H01L 27/0248 257/500 |
| 5,693,973 A | 12/1997 | Nakano et al. | |
| 2002/0027250 A1* | 3/2002 | Nagaya | H01L 23/62 257/355 |
| 2004/0056355 A1* | 3/2004 | Minami | H01L 23/5286 257/758 |
| 2007/0158817 A1 | 7/2007 | Katoh et al. | |
| 2008/0142986 A1* | 6/2008 | Yasumori | H01L 23/5223 257/773 |
| 2009/0050969 A1* | 2/2009 | Takasu | H01L 27/0266 257/360 |
| 2009/0147419 A1* | 6/2009 | Hung | H02H 9/042 361/56 |
| 2010/0328916 A1 | 12/2010 | Hirose et al. | |
| 2011/0150135 A1 | 6/2011 | Singor | |
| 2013/0228867 A1 | 9/2013 | Suematsu et al. | |
| 2014/0167781 A1 | 6/2014 | Asano et al. | |
| 2014/0374754 A1 | 12/2014 | Hirose et al. | |

FOREIGN PATENT DOCUMENTS

| | | |
|---|---|---|
| JP | H02-246360 A | 10/1990 |
| JP | H03-62962 A | 3/1991 |
| JP | H05-326851 A | 12/1993 |
| JP | H08-148650 A | 6/1996 |
| JP | H08-274167 A | 10/1996 |
| JP | H11-307724 A | 5/1999 |
| JP | H11-312783 A | 11/1999 |
| JP | 2011-029614 A | 2/2011 |
| JP | 2013-183072 A | 9/2013 |
| WO | WO-2005/088701 A1 | 9/2005 |
| WO | WO-2013/018134 A1 | 2/2013 |

OTHER PUBLICATIONS

Extended European Search Report dated Nov. 29, 2018 in Application No. 16782935.7.

* cited by examiner

US 10,615,076 B2

SEMICONDUCTOR CHIP HAVING ON-CHIP NOISE PROTECTION CIRCUIT

TECHNICAL FIELD

The present invention relates to a semiconductor chip having a function of protecting an internal circuit from noise by using a protective circuit formed on a chip.

BACKGROUND ART

When an excessive voltage is applied to an internal circuit of a semiconductor chip due to noise such as static electricity or surge, dielectric breakdown of a gate oxide film and destruction or deterioration of PN junction are caused, so that permanent failure, change in circuit characteristics, or the like of the semiconductor chip occur. In order to prevent the destruction or deterioration of the internal circuit caused by such noise and to realize a semiconductor chip having higher reliability, a protective circuit needs to be provided between a pad and the internal circuit so that an excessive voltage is not applied to the internal circuit even when noise is applied. In the technique described in PTL 1, a polysilicon resistor and a clamp transistor are provided between an input pad and an internal circuit. When an excessive voltage is applied to the pad, the clamp transistor breaks down or snaps back to a low resistance state, and thus, a current flows from the pad to the ground terminal through the polysilicon resistor and the clamp transistor. At this time, most of the energy of noise is absorbed by the polysilicon resistor, and the voltage applied to the internal circuit is clamped to a certain value or less, so that it is possible to prevent the above-mentioned element destruction and deterioration in characteristics.

CITATION LIST

Patent Literature

PTL 1: Japanese Patent Application Publication No. 61-32563

SUMMARY OF INVENTION

Technical Problem

However, in the technology in the related art, a contact is needed in order to connect the pad and the polysilicon resistor, and there is a problem that the contact is easily broken by noise. In general, the contact is configured with a metal material such as tungsten, and one polysilicon resistor is configured with a semiconductor material, so parasitic resistance occurs at the junction between the contact and the polysilicon resistor. In addition, in recent years, due to miniaturization, the contact size may be reduced, and thus, the contact is relatively high in resistance. As a result, the energy of noise concentrates on the contact, and the contact may be burned out.

The present invention has been made in view of the above circumstances, and an object of the present invention is to provide a semiconductor chip having higher reliability by improving noise tolerance of an on-chip noise protective circuit.

Solution to Problem

According to the present invention for achieving the above object, there is provided a semiconductor chip in which a resistance value of a metal interconnection on a path leading from a pad to a protective element is higher than a resistance value of the protective element.

Advantageous Effects of Invention

According to the present invention, no contact is required between a pad and a protective resistor, and thus, it is possible to provide a semiconductor chip having higher reliability.

DESCRIPTION OF EMBODIMENTS

Figure 1:
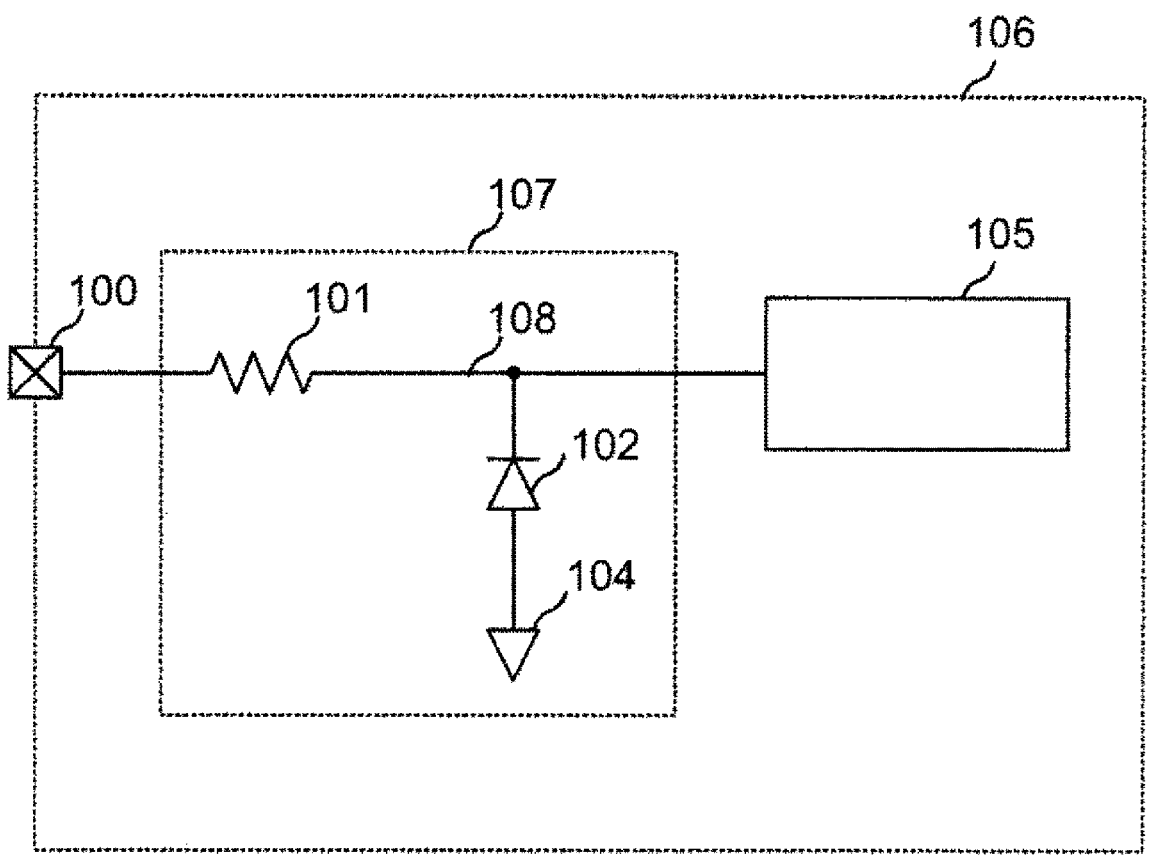
FIG. 1 is a diagram illustrating a circuit configuration of a semiconductor chip according to a first embodiment.
Figure 2:
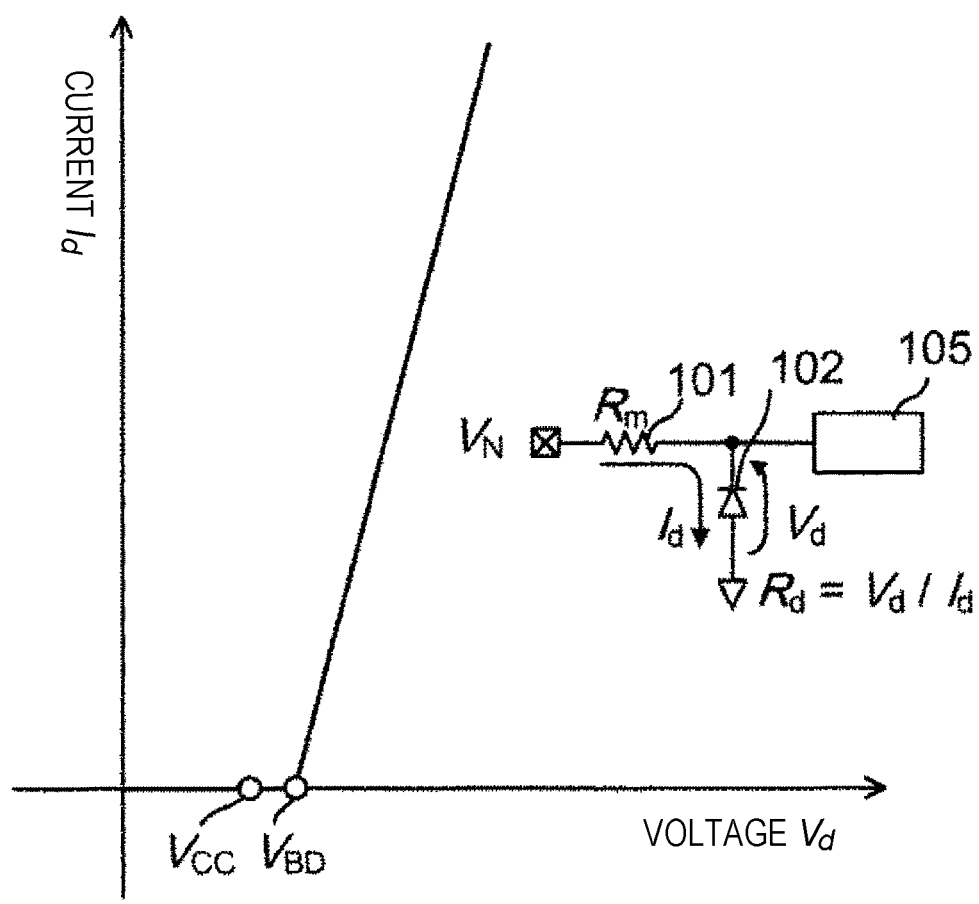
FIG. 2 is a diagram illustrating a resistance value of a protective element.
Figure 3:
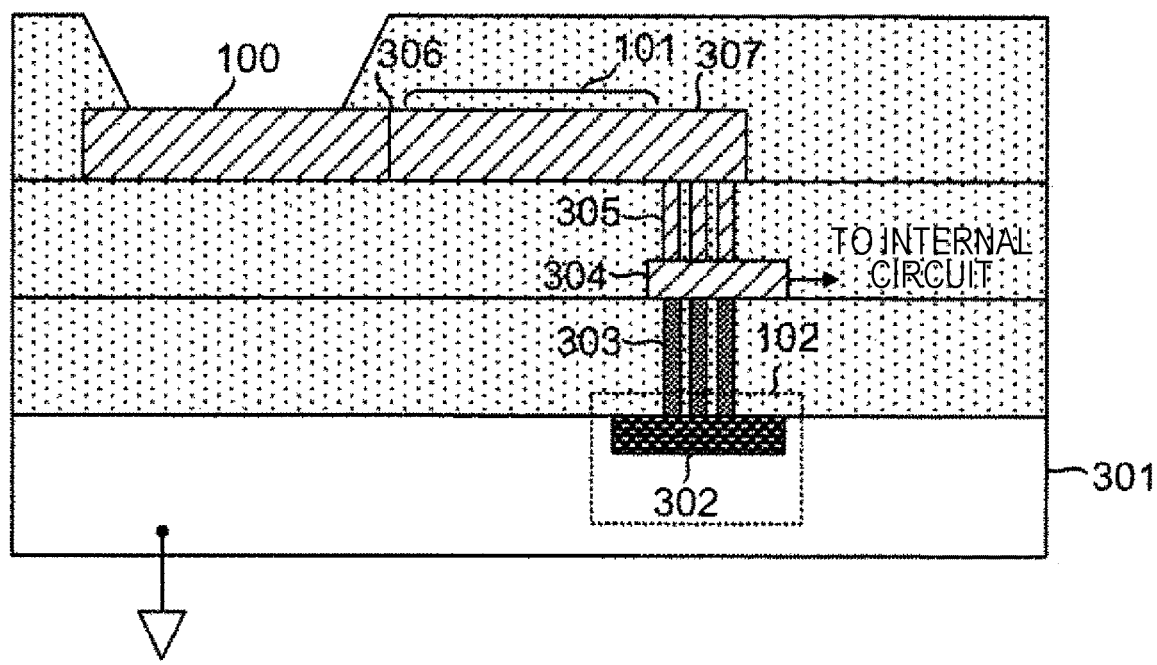
FIG. 3 is a cross-sectional diagram of a semiconductor chip according to the first embodiment.

Hereinafter, embodiments of the present invention will be described with reference to the drawings. A semiconductor chip according to a first embodiment of the present invention will be described with reference to FIGS. 1, 2, and 3. FIG. 1 illustrates a circuit configuration of the semiconductor chip according to the first embodiment. FIG. 2 is a diagram illustrating an example of characteristics of a protective element 102. FIG. 3 is a cross-sectional diagram including a pad 100 of the semiconductor chip illustrated in FIG. 1, a metal protective resistor 101, and the protective element 102.

The configuration of the semiconductor chip according to the embodiment will be described with reference to FIG. 1. The semiconductor chip 106 according to the embodiment is configured to include a pad 100, a metal protective resistor 101, a protective element 102 (hereinafter, the metal protective resistor 101 and the protective element 102 are collectively referred to as a protective circuit 107), a ground 104, and an internal circuit 105 which includes an MOS transistor. The pad 100 is configured with a metal material such as aluminum. Like the pad 100, the metal protective resistor 101 is configured with a metal material such as aluminum. The protective element 102 is a diode element of which an anode is connected to the ground 104 and of which a cathode is connected to interconnection 108 extending from the metal protective resistor 101 to the internal circuit 105, and for example, the protective element is obtained by forming an N-type diffusion layer on a P-type substrate. A resistance value $R_m$ of the metal protective resistor 101 is set to be higher than a resistance value $R_d$ of the protective element 102. In other words, the metal interconnection connecting the protective element 102 and the pad 100 has a high resistance portion having a resistance higher than that of the protective element 102 on an electrical path between the protective element 102 and the pad 100.

Operations at the time of applying noise in the embodiment will be described with reference to FIG. 2. FIG. 2 illustrates a current-voltage characteristic of the diode at the time of reverse biasing. During a normal operation of the semiconductor chip 106, the diode is reverse-biased with a voltage near an operating voltage $V_{CC}$ of the internal circuit, and almost no current flows. On the other hand, when noise is applied to the pad 100 and a voltage across the diode becomes equal to or higher than a breakdown voltage $V_{BD}$, a current $I_d$ flows through the diode due to a physical phenomenon called Zener breakdown or avalanche breakdown. At this time, if the energy consumed by the metal protective resistor 101 and the energy consumed by the diode are denoted by $E_m$ and $E_d$, respectively, the following relationship is satisfied.

$$E_m = \frac{V_N^2 \times R_m}{(R_m + R_d)^2} \qquad \text{[Mathematical Formula 1]}$$

$$E_d = \frac{V_N^2 \times R_d}{(R_m + R_d)^2} \qquad \text{[Mathematical Formula 2]}$$

Herein, the noise voltage applied to the pad 100 is denoted by $V_N$. In addition, $R_d$ is defined by dividing the voltage $V_d$ across the diode by $I_d$ and is defined as including a resistance component of the diode itself and a resistance component of the contact to the diffusion layer. In addition, since the current consumption of the internal circuit 105 is very small in comparison with the current $I_d$ at the time of breakdown of the diode, the current consumption is neglected herein. As can be seen from Mathematical Formulas 1 and 2, the ratio of the energy consumed by the protective resistor and the diode is equal to the ratio of the respective resistances. Since $R_m$ is larger than $R_d$ in the embodiment, a half or more of the energy of noise can be absorbed by the resistance, and thus, it is possible to prevent the diode element including the contact from being destructed.

In the semiconductor chip 106, the pad 100 has a function of any one of a power supply terminal, a signal input terminal, a signal output terminal, and a signal input/output terminal. In the case where the pad 100 is a power supply terminal, it is preferable to set the resistance value $R_m$ of the metal protective resistor 101 so as to satisfy the following mathematical formula.

$$R_d < R_m < \frac{V_{IN} - V_{CCMIN}}{I_{CC}} \qquad \text{[Mathematical Formula 3]}$$

Herein, $V_{IN}$ is a voltage supplied to the pad at the time of using the semiconductor chip, $V_{CCMIN}$ is a minimum operating voltage of the internal circuit 105, and $I_{CC}$ is current consumption of the internal circuit 105. By setting $R_m$ to be within the range of the mathematical formula (Mathematical Formula 3), it is possible to prevent the internal circuit 105 from malfunctioning due to the voltage drop caused by the protective resistor during a normal operation, and thus, it is possible to realize a semiconductor chip having higher reliability.

FIG. 3 is a diagram illustrating an example of a cross-sectional structure from the pad 100 to the protective circuit 107 in FIG. 1. The metal protective resistor 101 is configured with the same metal interconnection layer as the pad 100, and an input end 306 of the metal protective resistor 101 is directly connected to the pad 100. On the other hand, an output end 307 of the metal protective resistor 101 is connected to a diffusion layer 302 of the protective element 102 through a via 305, a lower metal interconnection layer 304, and a contact 303 to the diffusion layer. According to such a configuration, a contact vulnerable to noise is not required between the pad 100 and the metal protective resistor 101, so that the noise tolerance of the semiconductor chip 106 is improved. Another advantage of this configuration is an improvement in the withstand voltage of the protective resistor to the substrate. A reference of the withstand voltage of the oxide film is generally 10 MV/cm, in other words, 1 V per 1 nm. Namely, as the distance between the protective resistor and a substrate 301 increases, the breakdown voltage of the interlayer insulating film between the protective resistor and the substrate is improved. In this configuration, since the metal protective resistor 101 and the input terminal 306 of the metal protective resistor 101 to which a high voltage caused by noise is directly applied are located at positions separated from the substrate 301, in comparison with the polysilicon protective resistor formed on a field oxide film described in PTL 1, the withstand voltage of the input end 306 of the metal protective resistor 101 to the substrate is improved. In the electrostatic test, depending on the standard, a voltage of 200 to 500 V is instantaneously applied to the pad, so in order to prevent dielectric breakdown of the interlayer insulating film between the metal protective resistor 101 and the substrate 301, the metal protective resistor 101 and the substrate 301 is preferably separated by 500 nm or more. Namely, it is preferable that the thickness of the stacked structure of the insulating film formed over the substrate 301 be 500 nm or more, and a metal interconnection film be formed on this stacked structure. In the example illustrated in FIG. 3, the case where the number of the metal interconnection layers is two is illustrated, but the number of the metal interconnection layers is not limited to two. Even in the case of one layer or three or more layers, the same effect can be obtained by the same structure.

Figure 12:
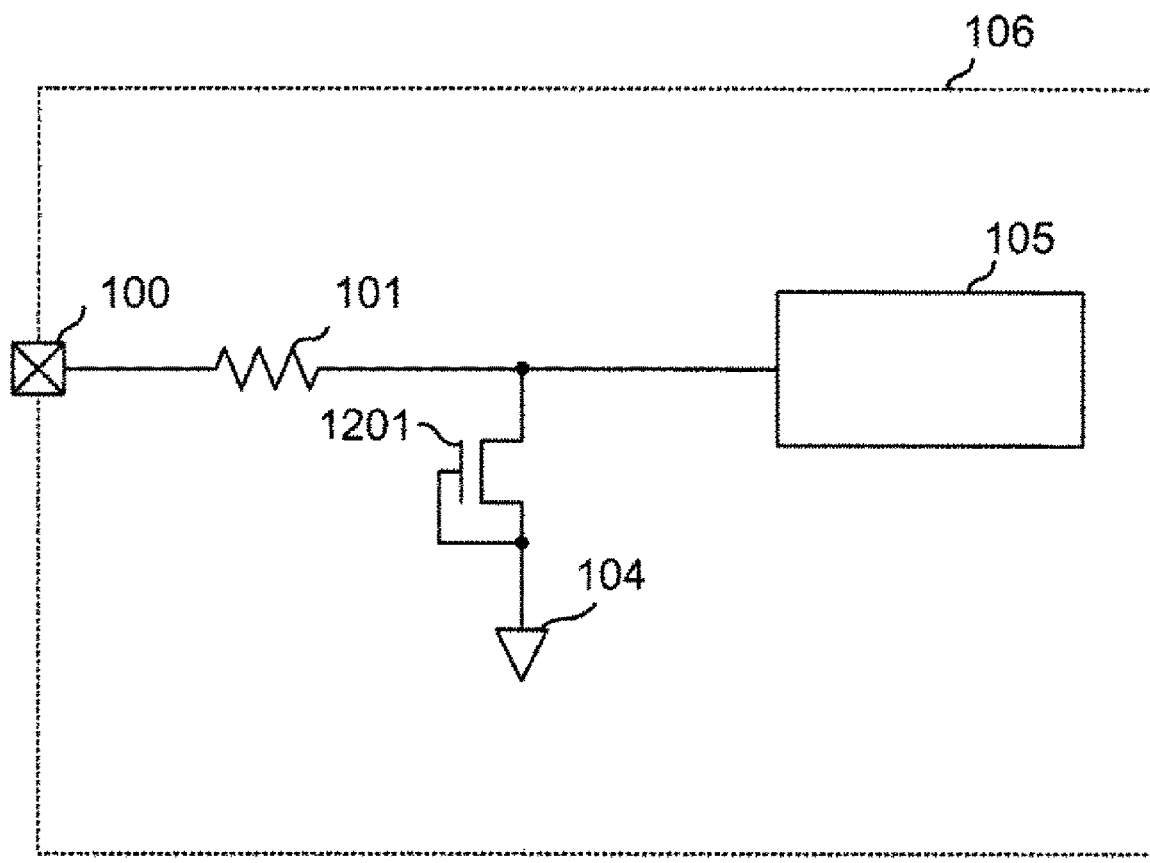
FIG. 12 is a diagram illustrating a modified example of the first embodiment.
Figure 13:
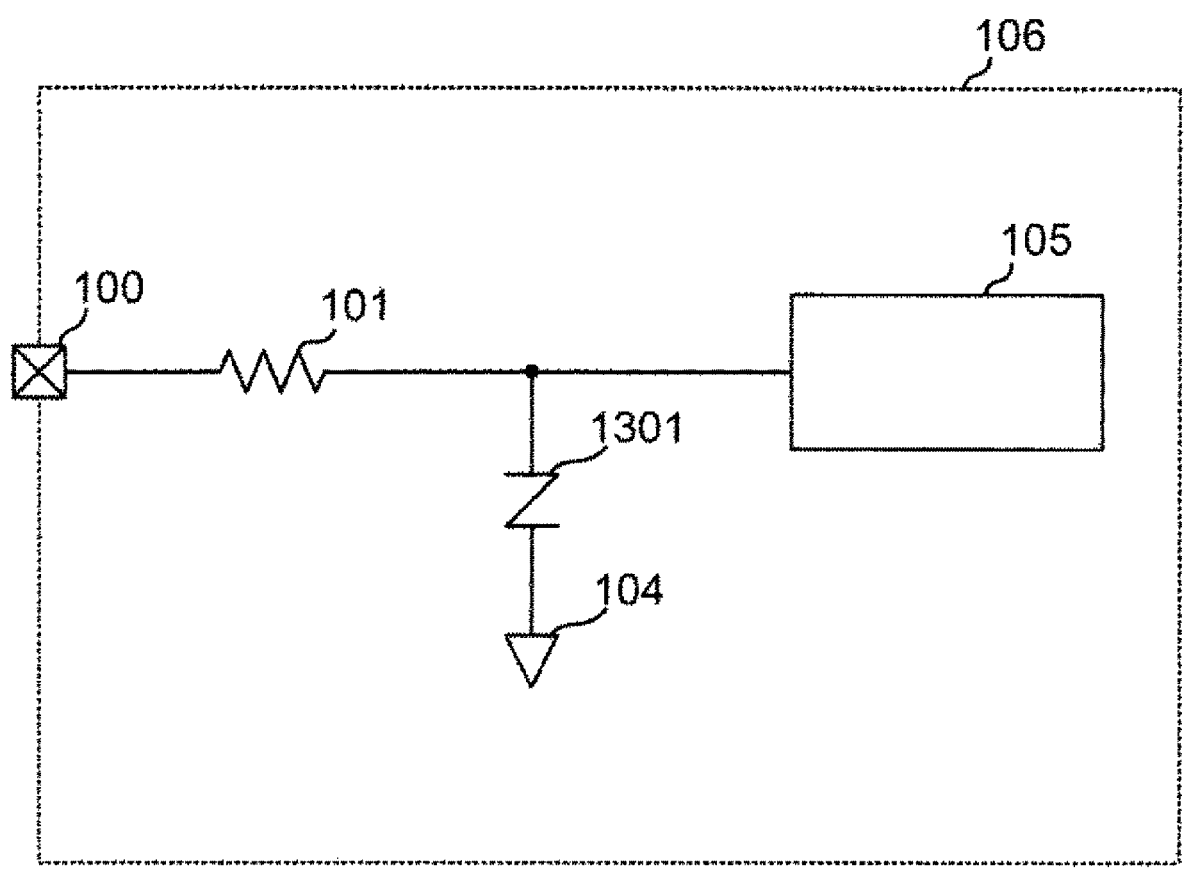
FIG. 13 is a diagram illustrating a modified example of the first embodiment.
Figure 21:
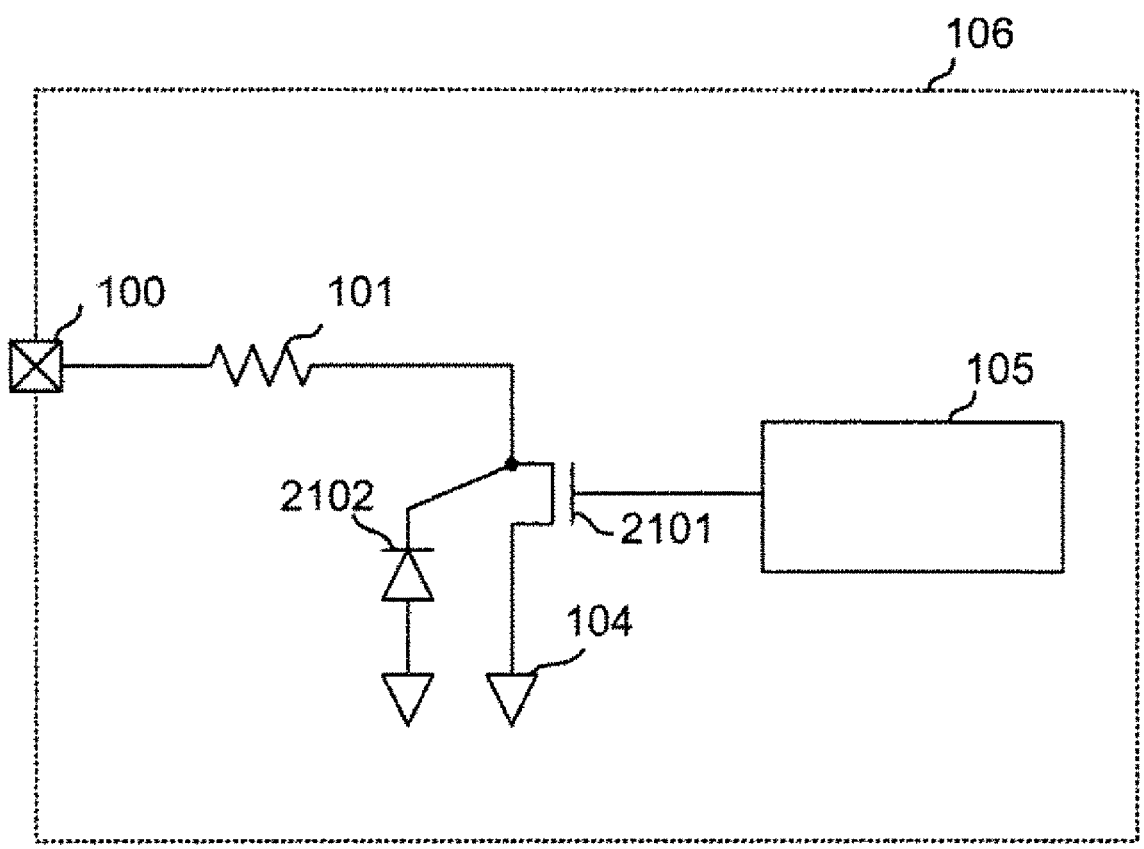
FIG. 21 is a diagram illustrating a modified example of the first embodiment.
Figure 22:
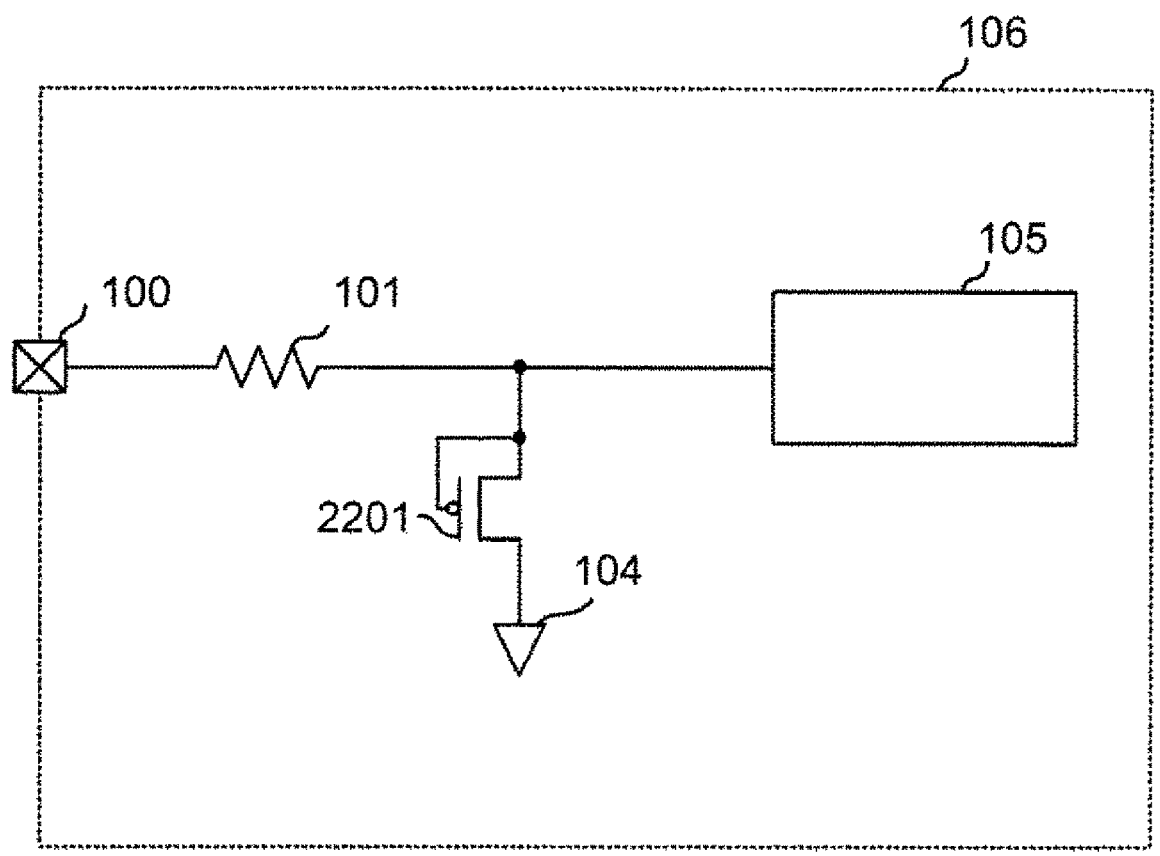
FIG. 22 is a diagram illustrating a modified example of the first embodiment.

In addition, the type of the protective element 102 is not limited to a diode. For example, a gate-grounded NMOS (ggNMOS) 1201 having a gate and a source connected to the ground as illustrated in FIG. 12 or a PMOS 2201 having a gate and a source connected to a high potential side as illustrated in FIG. 22 may be used. In addition, as illustrated in FIG. 13, a varistor element 1301 may be used. In addition, as illustrated in FIG. 21, in the case where a drain diffusion layer of the transistor 2101 is connected to the metal protective resistor 101, a parasitic diode 2102 formed between the diffusion layer of the transistor 2101 and the substrate or the well may be used as a protective element. The transistor 2101 is not limited to an NMOS transistor illustrated in FIG. 21, but the transistor may be a PMOS transistor or a bipolar transistor. In the case of a bipolar transistor, the parasitic diode is formed between any one of the collector, the base, and the emitter and the substrate or the well.

The effects of the semiconductor chip 107 according to the embodiment will be described. The first effect is that, since there is no contact vulnerable to noise between the pad 100 and the metal protective resistor 101 and the contact to the protective element 102 is protected by the metal protective resistor 101 of the anterior stage, the protective circuit 107 is hard to be destroyed with respect to noise. The second effect is that, since the input terminal of the protective resistor is separated from the substrate in comparison with the polysilicon protective resistor in the related art, the withstand voltage to the substrate is higher, and thus, it is possible to provide a protection function with respect to higher voltage noise.

Figure 4:
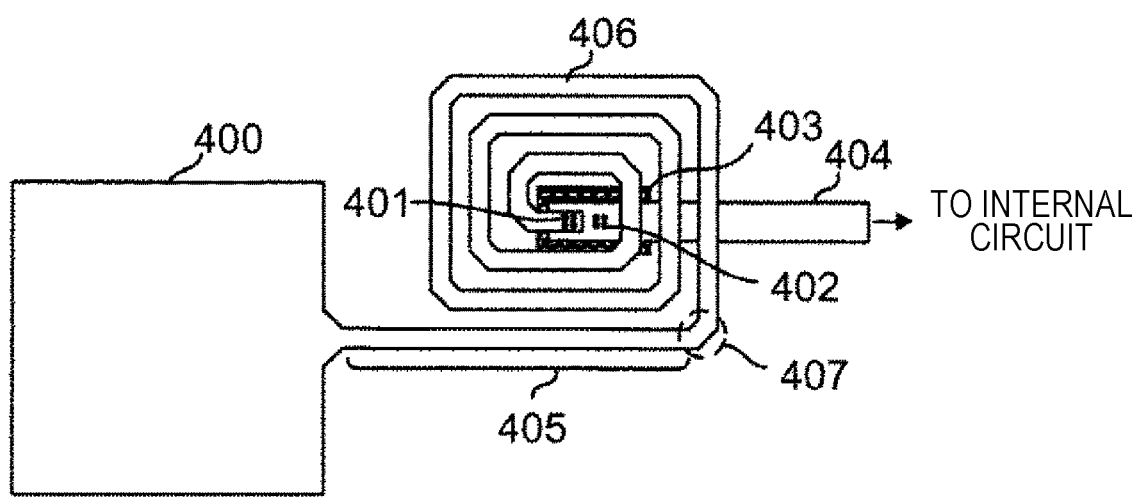
FIG. 4 is a top diagram of a semiconductor chip according to a second embodiment.

A protective circuit of a semiconductor chip according to a second embodiment of the present invention will be described with reference to FIG. 4. FIG. 4 is a top diagram of the protective circuit of the semiconductor chip according to the second embodiment. Description of the same configurations as in the first embodiment will be omitted. The protective circuit according to the second embodiment is characterized in that the metal protective resistor 101 in the semiconductor chip 106 according to the first embodiment is configured with a spiral metal interconnection resistor 406. The metal interconnection resistor 406 is configured with the same interconnection layer as a pad 400 and is connected to a diffusion layer 403 of the protective element 102 through a via 401, a lower interconnection layer 404, and a contact 402. According to such a configuration, in addition to the same effect as in the semiconductor chip 106 illustrated in the first embodiment, due to an inductance component of the spiral metal interconnection, higher impedance to noise having a high frequency component such as static electricity can be provided to the metal protective resistor 101. Specifically, the impedance $Z_m$ of the metal protective resistor 101 is expressed by the following mathematical formula.

$$Z_m = R_m + j\omega L_m \quad \text{[Mathematical Formula 4]}$$

Herein, $R_m$ is a resistance component of the metal interconnection resistor 101, $\omega$ is an angular frequency of the noise, and $L_m$ is inductance of the metal interconnection resistor 101. Assuming that the noise voltage is $V_N$ and the ON resistance of the protective element is $R_d$, the voltage $V_d$ applied to the internal circuit can be obtained by the following mathematical formula.

$$V_d = V_N \times \left| \frac{R_d}{R_m + j\omega L_m + R_d} \right| = \quad \text{[Mathematical Formula 5]}$$

-continued
$$V_N \times \frac{R_d}{\sqrt{(R_m - R_d)^2 + \omega^2 L^2}}$$

As can be seen from Mathematical Formula 5, the voltage applied to the internal circuit at the time of applying the noise is lowered by the inductance of the metal interconnection resistor 101. In other words, the protection performance of the metal protective resistor 101 improves.

More preferably, the spiral metal interconnection resistor 406 may be configured to have corner portions. More specifically, the bent angle of the interconnection is allowed to be smaller than 90 degrees. FIG. 4 illustrates an example in which corner portions 407 of the metal interconnection resistor 406 are configured by twice bending at 45 degrees. In addition, the extraction portion from the pad 400 may be formed to have a straight line section 405 to a certain extent. According to such a configuration, it is possible to suppress the damage of the interconnection due to the concentration of the current on the corner portions of the interconnection at the time of applying noise, and thus, it is possible to realize a semiconductor chip having higher reliability.

Figure 5:
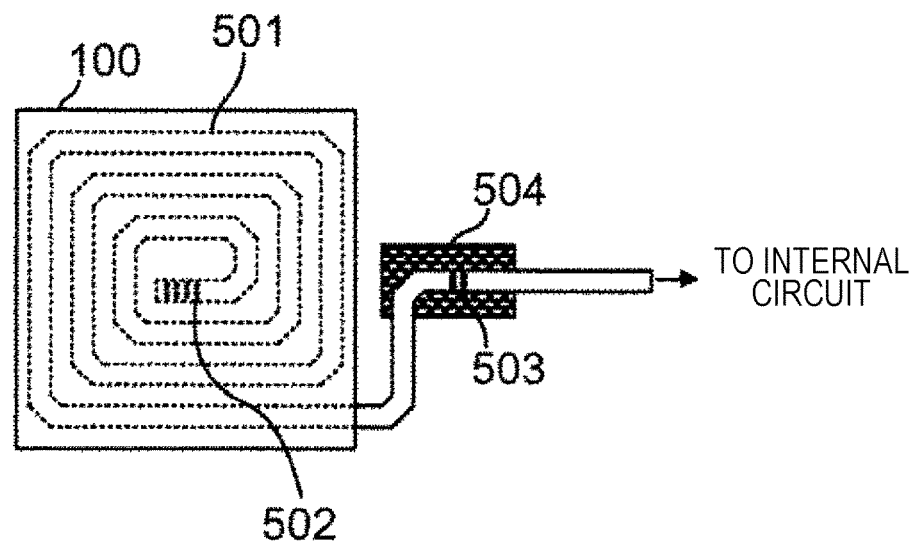
FIG. 5 is a diagram illustrating a modified example of the second embodiment.

FIG. 5 illustrates a modified example of the protective circuit of the semiconductor chip according to the second embodiment. The protective circuit according to the embodiment is characterized in that the metal protective resistor 101 is configured with a spiral metal interconnection resistor 501 formed below the pad 100 and the metal protective resistor is arranged below the pad. According to such a configuration, in addition to the same effect as in the second embodiment, since the metal protective resistor 101 is formed between the pad 100 and the contact 303, it is possible to further reduce the area of the protective circuit.

Figure 6:
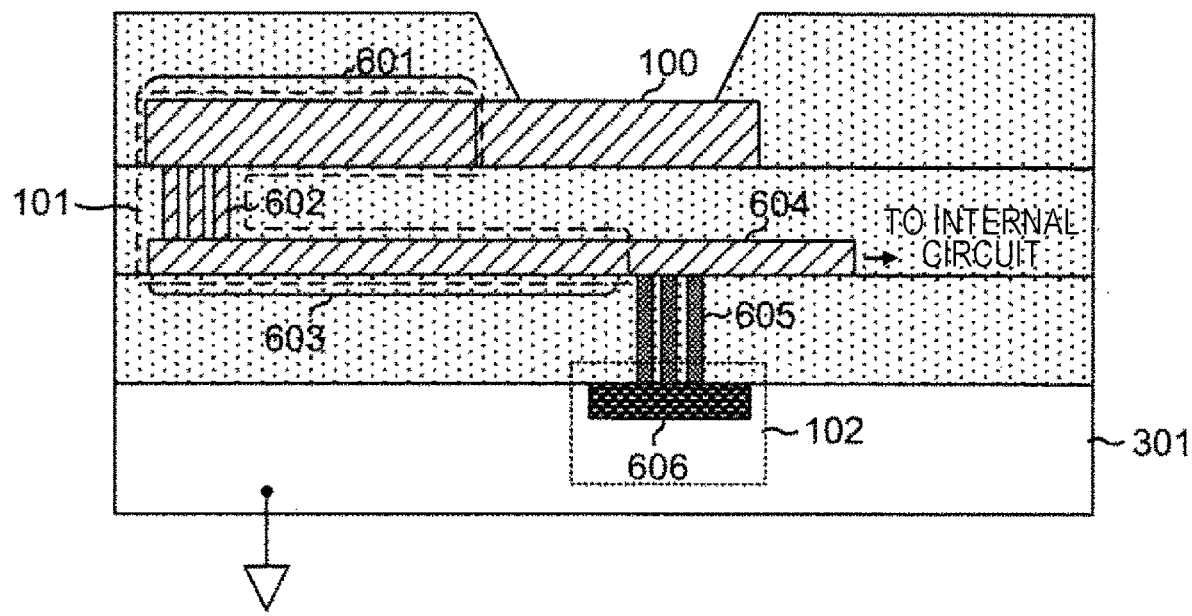
FIG. 6 is a cross-sectional diagram of a semiconductor chip according to a third embodiment.

A protective circuit of a semiconductor chip according to a third embodiment of the present invention will be described with reference to FIG. 6. FIG. 6 is a cross-sectional diagram of a protective circuit of the semiconductor chip according to the third embodiment. Description of the same configurations as in the first embodiment will be omitted. The protective circuit 107 according to the third embodiment is characterized in that the metal protective resistor 101 according to the first embodiment is configured with a metal interconnection 601 in the same layer as the pad 100, a metal interconnection 603 below the pad 100, and a via 602 connecting the metal interconnection 601 and the metal interconnection 603. The terminal of the metal interconnection 603 closer to the internal circuit is connected to a diffusion layer 606 of the protective element 102 by the contact 605. According to such a configuration, in addition to the same effect as in the first embodiment, it is possible to secure a larger interconnection length with the same resistance area as in the first embodiment. Namely, the high resistance of the protective resistor can be implemented. In other words, in comparison with the same resistance value, it is possible to reduce the area of the resistor. In FIG. 6, the metal protective resistor 101 is configured by using two metal interconnection layers, but three or more metal interconnection layers may be used. In this case, it is possible to further reduce the area of the metal protective resistor 101.

Figure 7:
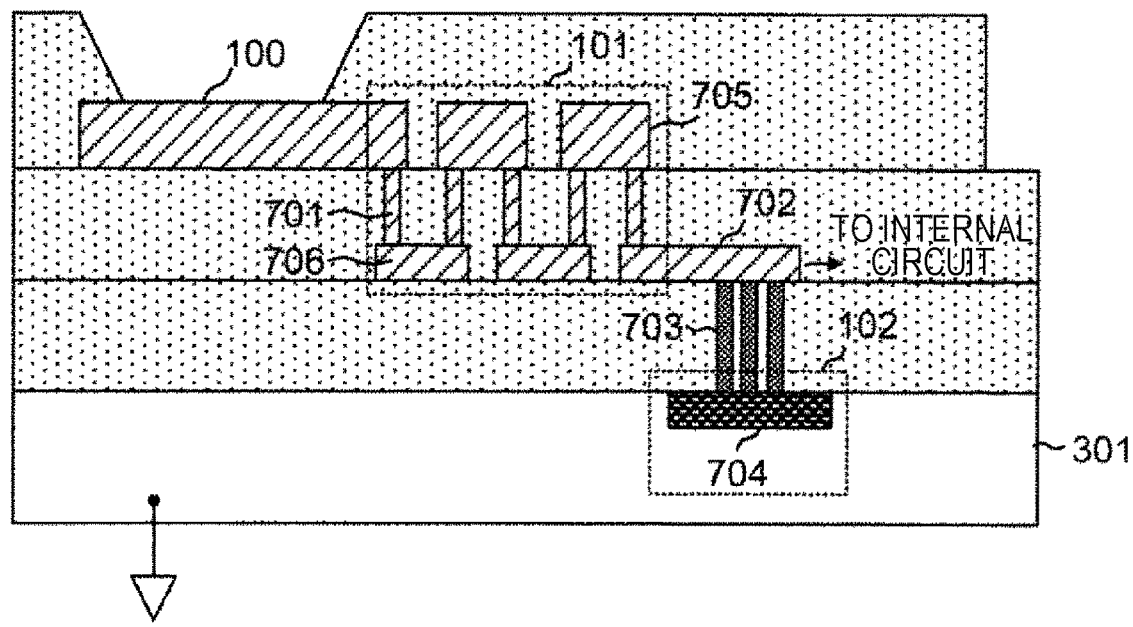
FIG. 7 is a diagram illustrating a modified example of the third embodiment.

FIG. 7 illustrates a modified example of the protective circuit of the semiconductor chip according to the third embodiment. In the protective circuit according to the modified example, the metal protective resistor 101 is configured with a plurality of interconnection layers and vias. Namely, the protective circuit is characterized in that metal interconnection layers 705 and metal interconnection layers 706 below the metal interconnection layers are connected in series through vias 701. According to such a configuration, in addition to the same effect as in the first embodiment, it is possible to secure a larger interconnection length with the same resistance area as in the first embodiment. Namely, the high resistance of the protective resistor can be implemented. In other words, in comparison with the same resistance value, it is possible to reduce the area of the resistor. In addition, if the material of the via 701 is a high resistance metal such as tungsten, it is possible to further reduce the area.

Figure 8:
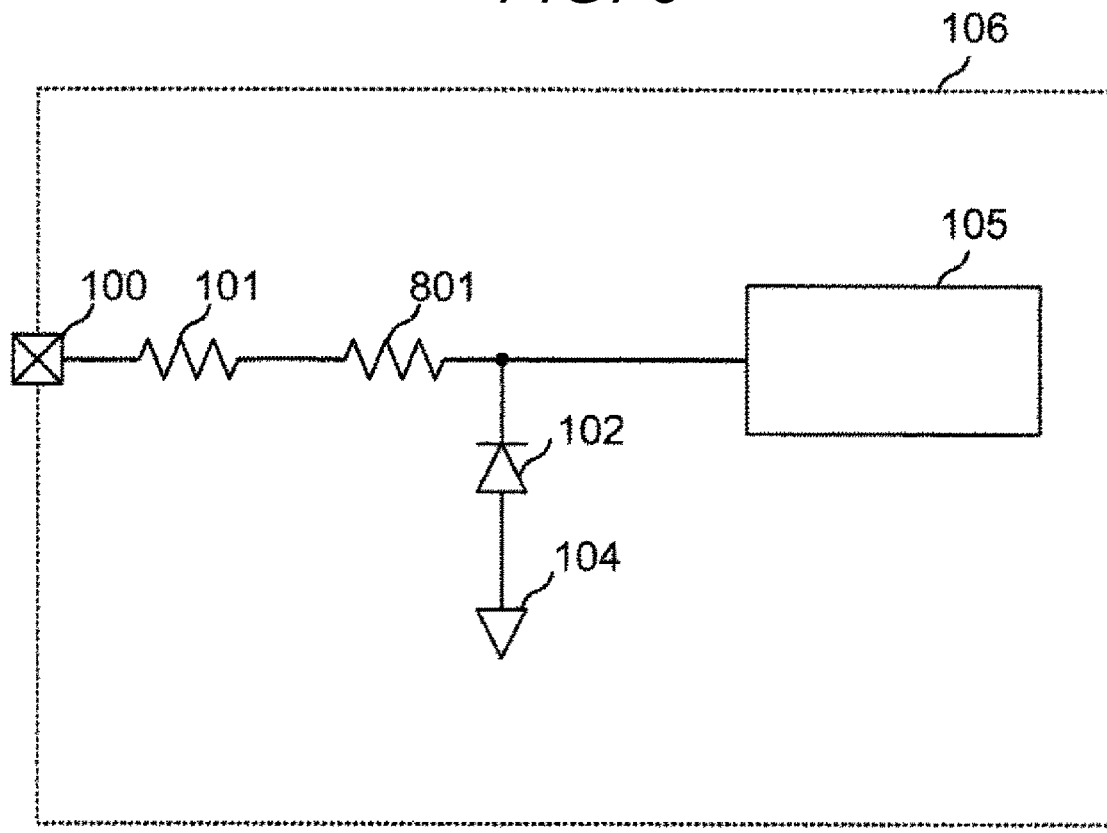
FIG. 8 is a diagram illustrating a circuit configuration of a semiconductor chip according to a fourth embodiment.
Figure 9:
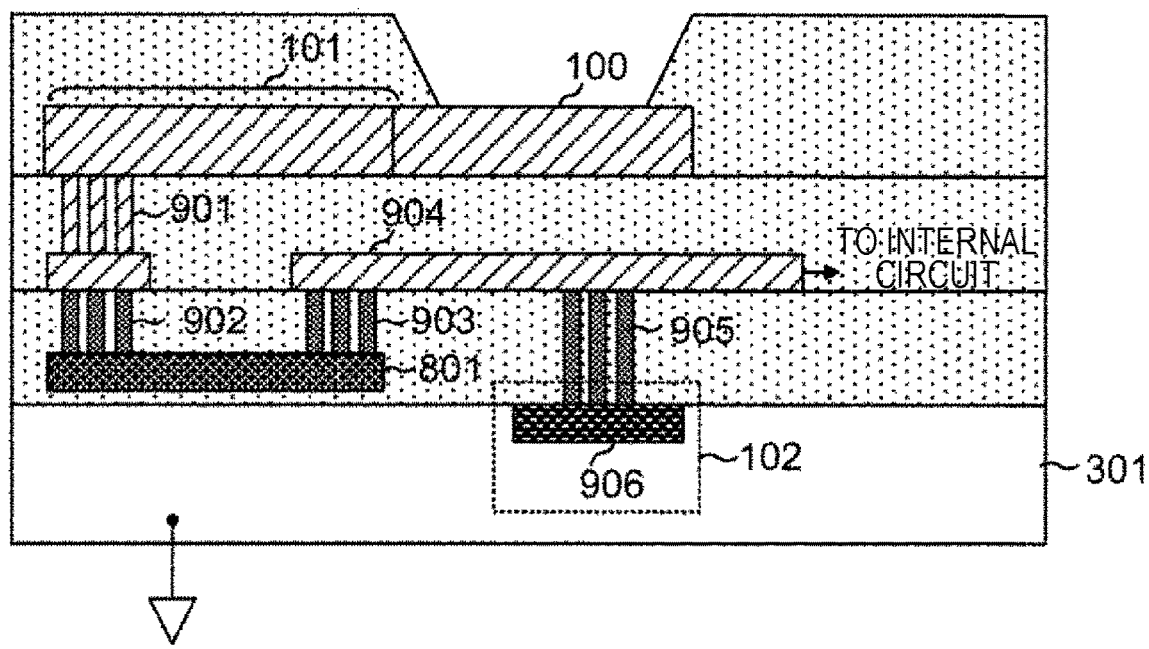
FIG. 9 is a cross-sectional diagram of a semiconductor chip according to the fourth embodiment.

A protective circuit of a semiconductor chip according to a fourth embodiment of the present invention will be described with reference to FIG. 8. The protective circuit according to the embodiment is characterized in that a polysilicon resistor 801 is further connected in series between the protective resistor 101 and the protective element 102 in the semiconductor chip 106 according to the first embodiment. FIG. 9 is a diagram illustrating an example of the cross-sectional structure from the pad to the protective circuit in FIG. 8. The protective resistor 101 is configured in the same metal interconnection layer as the pad 100, and the protective resistor 101 is connected to the polysilicon resistor 801 through a via 901 and a contact 902. In general, the resistivity of the polysilicon resistor is higher than that of the metal interconnection resistor by one or more orders of magnitude, and thus, if the same resistance value is used, the polysilicon resistor can be made smaller in area than the metal interconnection resistor. In the embodiment, the contact 902 to the polysilicon resistor 801 vulnerable to noise is protected by the metal interconnection resistor 101. In addition, the metal interconnection resistor 101 also has an effect of lowering the voltage applied to the polysilicon resistor 801. The noise voltage is lowered by using the metal interconnection resistor 101 having a high withstand voltage to the substrate, the polysilicon resistor having a relatively low withstand voltage to the substrate can also be used. On the other hand, a portion of the protective resistor is configured with a polysilicon resistor having high resistivity, so that it is possible to reduce the area when viewed as the whole protective resistor. According to such a configuration, in addition to the same effect as in the first embodiment, it is possible to reduce the area of the resistor in comparison with the first embodiment. As a modified example of the fourth embodiment, the metal protective resistor 101 may be configured in the spiral shape described in the second embodiment, in the multiple metal film layer structure described in the third embodiment, or in a combination of the spiral shape in the second embodiment and the multiple metal film layer structure in the third embodiment, and the same effect can be obtained.

Figure 10:
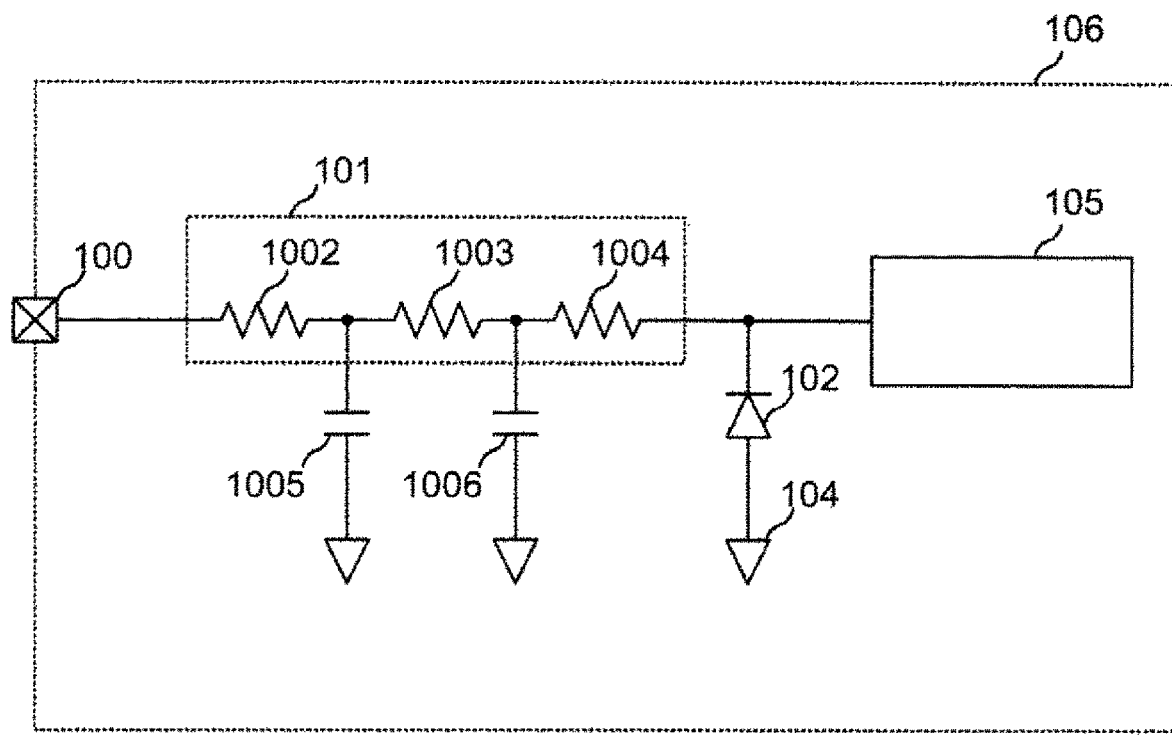
FIG. 10 is a diagram illustrating a circuit configuration of a semiconductor chip according to a fifth embodiment.

A protective circuit of a semiconductor chip according to a fifth embodiment of the present invention will be described with reference to FIG. 10. The protective circuit 107 according to the embodiment is characterized in that a protective capacitor 1005 is added in parallel to the metal protective resistor 101 in the first embodiment. In FIG. 10, for the convenience of description, the metal protective resistor 101 is virtually divided into three series resistors 1002, 1003, and 1004, and protective capacitors 1005 and 1006 are connected between the resistors. However, the number of division and the connection positions of the protective capacitors are not limited thereto. Since the metal protective resistor 101 and the protective capacitors 1005 and 1006 constitute an RC low-pass filter, the peak voltage in the protective circuit according to the embodiment can be lower with respect to high-frequency noise than the protective circuit according to the first embodiment. Therefore, when noise is applied, the voltage applied to the internal circuit is reduced, and thus, it is possible to realize a semiconductor chip having higher reliability.

Figure 11:
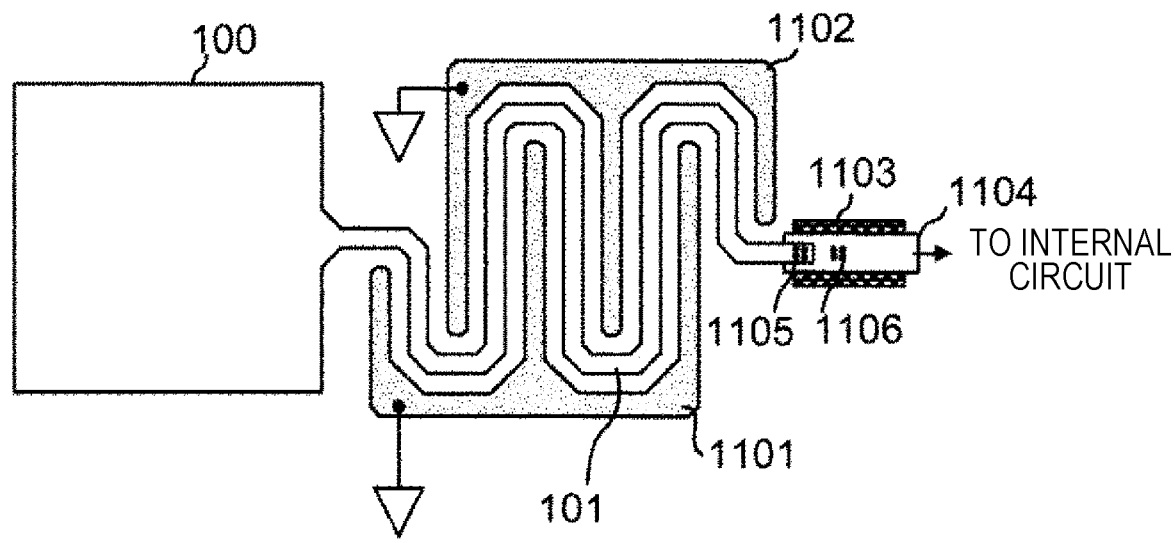
FIG. 11 is a top diagram of a semiconductor chip according to the fifth embodiment.

FIG. 11 is a top diagram illustrating an example of a structure from the pad to the protective circuit in FIG. 10. The protective circuit is characterized in that electrodes 1101 and 1102 are arranged on both sides of the metal interconnection resistor 101 by using the same metal interconnection layer. By fixing the electrodes 1101 and 1102 to the ground potential, parasitic capacitance formed between the metal interconnection resistor 101 and the electrode 1101 and parasitic capacitance formed between the metal interconnection resistor 101 and the electrode 1102 are used as protective capacitors 1005 and 1006, respectively. According to such a configuration, an RC low-pass filter can be configured without preparing a special capacitor element, and thus, it is possible to further reduce the area of the protective circuit.

Figure 17:
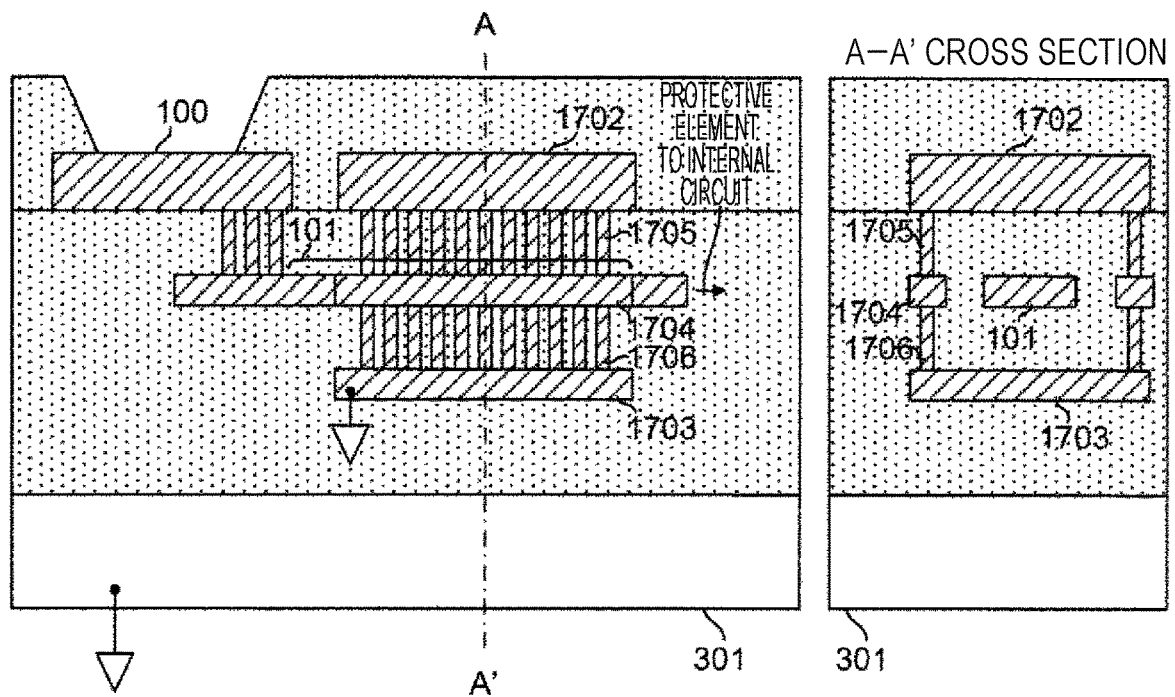
FIG. 17 is a diagram illustrating a modified example of the fifth embodiment.

The method of realizing the protective capacitors 1005 and 1006 is not limited to the structure of FIG. 10. For example, FIG. 17 illustrates another method of realizing the protective capacitor, and by arranging interconnections 1702, 1703, and 1704 and vias 1705 and 1706 connecting the interconnections so as to stereoscopically surround the upper, lower, left and right sides of the metal interconnection resistor 101, capacitors may be configured between the metal interconnection resistor 101 and the interconnection.

Figure 14:
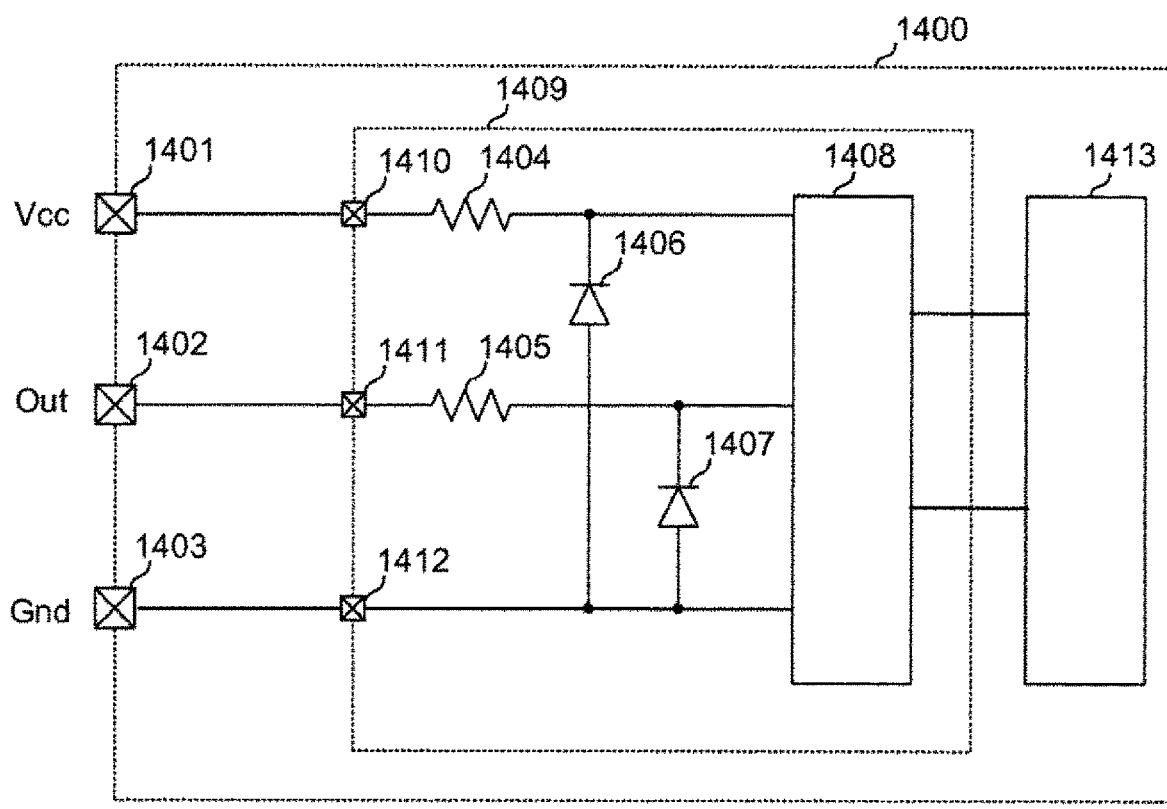
FIG. 14 is a diagram illustrating a circuit configuration of a semiconductor chip according to a sixth embodiment.

A sensor device 1400 including a semiconductor chip 1409 according to a sixth embodiment of the present invention will be described with reference to FIG. 14. The sensor device 1400 according to the embodiment is configured to include a sensor element 1413, a semiconductor chip 1409, a power supply terminal 1401, an output terminal 1402, and a ground terminal 1403. The sensor element 1413 is an element of which electric characteristic changes according to physical quantities. In FIG. 14, the sensor element 1413 is illustrated as a discrete component, but the sensor element may be formed in the semiconductor chip 1409. The semiconductor chip 1409 is configured to include a power supply pad 1410, an output pad 1411, a ground pad 1412, a metal protective resistor 1404, a metal protective resistor 1405, a protective element 1406, a protective element 1407, and an internal circuit 1408. The semiconductor chip 1409 controls the sensor element 1413, processes the output signal of the sensor element 1413, and outputs the output signal to the output pad 1411. The metal protective resistor 1404 and the metal protective resistor 1405, the protective element 1406 and the protective element 1407 are those illustrated in the above embodiments. From noise such as static electricity or surge applied from the outside of the sensor device 1400 to the terminals 1401, 1402, and 1403, the power supply terminal 1401 is protected by the protective resistor 1404 and the protective element 1406, and the output terminal 1402 is protected by the protective resistor 1405 and the protective element 1407. According to such a configuration, by providing the semiconductor chip 1409 with tolerance to noise, it is possible to reduce external protective elements of the semiconductor chip 1409, to reduce discrete components included in the sensor device 1400, and to enhance reliability of the sensor device 1400.

Figure 15:
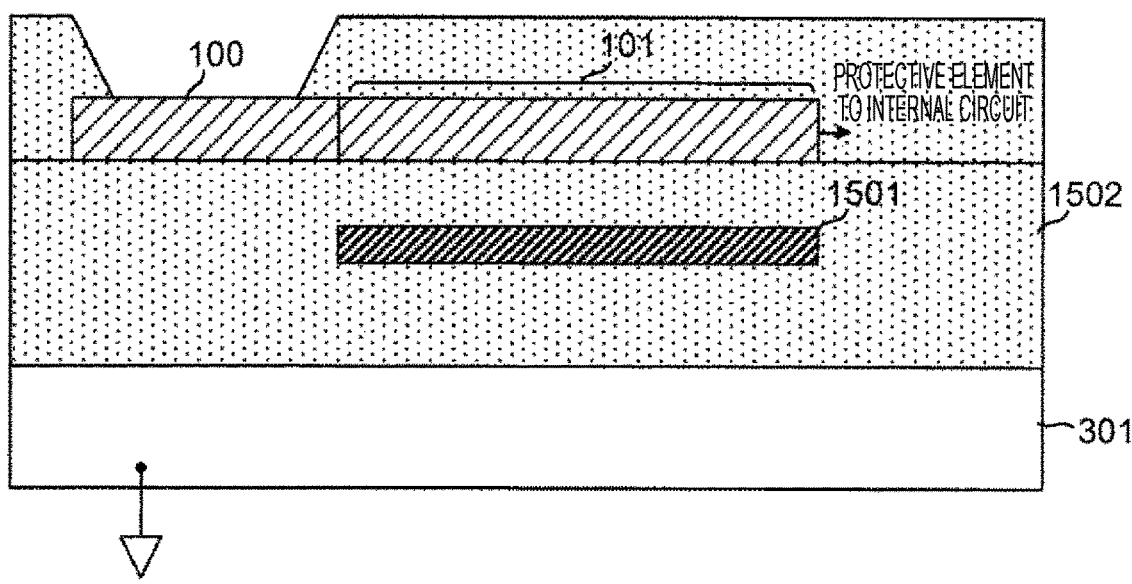
FIG. 15 is a cross-sectional diagram of a semiconductor chip according to a seventh embodiment.
Figure 16:
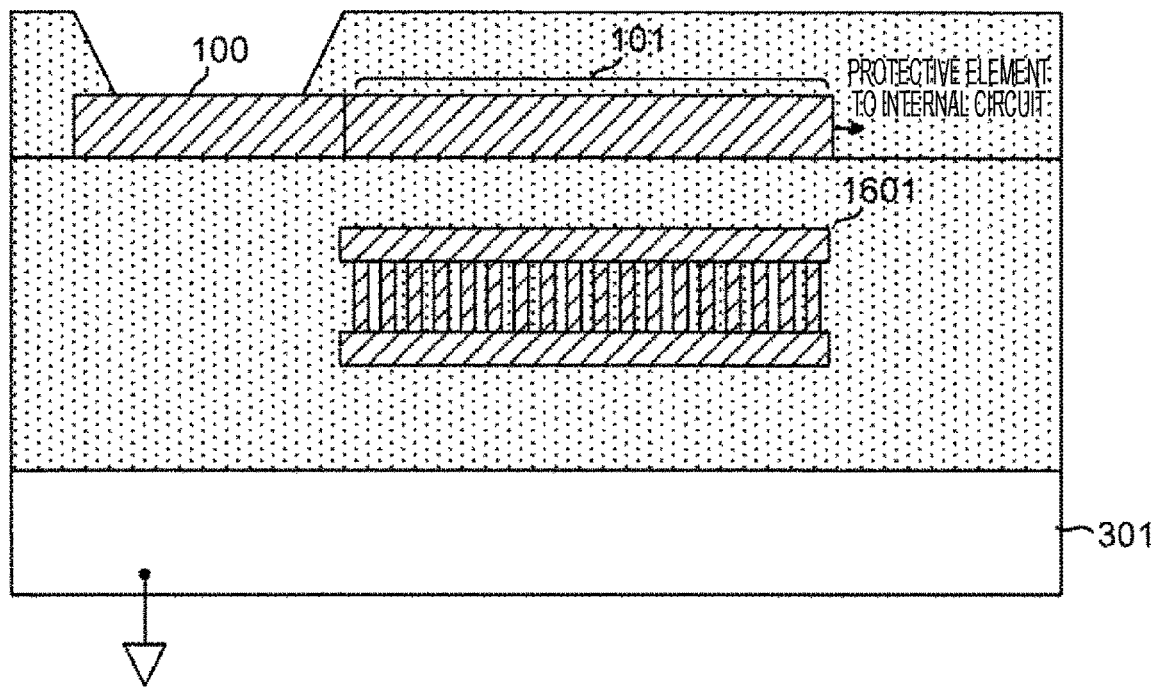
FIG. 16 is a diagram illustrating a modified example of the seventh embodiment.

A protective circuit of a semiconductor chip according to a seventh embodiment of the present invention will be described with reference to FIG. 15. FIG. 15 is a diagram illustrating an example of a cross-sectional structure of a protective circuit of the semiconductor chip according the seventh embodiment. The protective circuit 107 according to the embodiment is characterized in that a thin film 1501 having a thermal resistance lower than that of an interlayer insulating film 1502 is arranged between the metal protective resistor 101 and the substrate 301 in the semiconductor chip 106 according to the first embodiment. According to such a configuration, the heat generated by the protective resistor 101 at the time of applying the noise is more easily released to the substrate, and thus, it is possible to enhance the tolerance of the metal protective resistor 101 to the noise energy. As a result, it is possible to realize a more reliable semiconductor chip. For example, the interlayer insulating film 1502 is SiO2 (example of thermal resistance value: 0.77° C.·m/W), and as a material having a thermal resistance lower than that of SiO2, a silicon nitride film Si3N4 (example of thermal resistance value: 0.034° C.·m/W) or a mixture SiON thereof, aluminum oxide Al2O3, aluminum nitride AlN, and the like are suitable. In addition, the thin film 1501 having a thermal resistance lower than that of the interlayer insulating film 1502 is not limited to an insulating film such as a silicon nitride film. As illustrated in FIG. 16, a structure 1601 where a metal interconnection layer below the metal protective resistor 101 or a plurality of metal interconnection layers are connected through vias may be used. In general, the thermal resistance of the metal material is lower by about one order of magnitude than that of the silicon nitride film, and thus, it is possible to further improve the heat releasing property. As a result, it is possible to increase the tolerance of the protective resistor to the noise energy and to realize a semiconductor chip having higher reliability. The embodiment can be applied not only to the first embodiment but also to the other embodiments described above.

Figure 18:
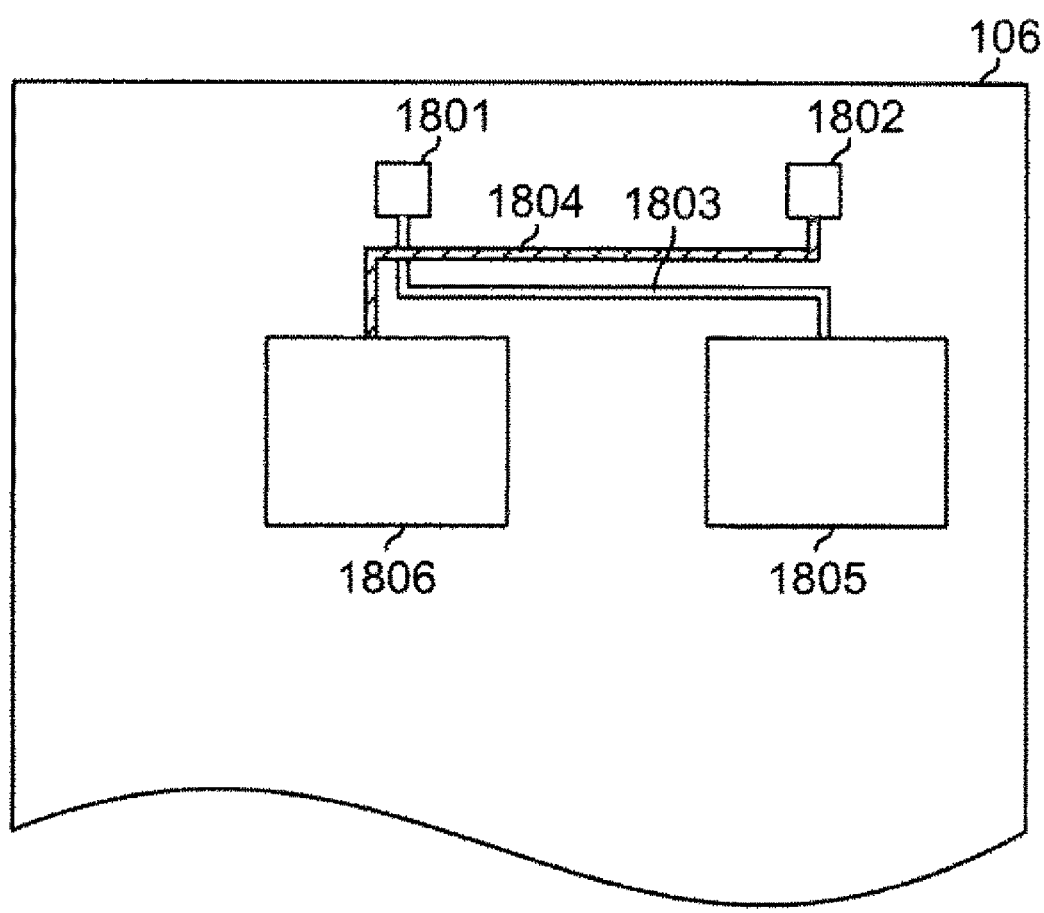
FIG. 18 is a top diagram of a semiconductor chip according to an eighth embodiment.

A protective circuit of a semiconductor chip according to an eighth embodiment of the present invention will be described with reference to FIG. 18. FIG. 18 is a layout diagram of a plurality of pads 1801 and 1802, metal interconnection resistors 1803 and 1804, and protective elements 1805 and 1806 on the semiconductor chip 106 according to the eighth embodiment. The protective circuit 107 according to the embodiment is characterized in that the pads 1801 and 1802 and the protective elements 1805 and 1806 corresponding to the pads 1801 and 1802 are arranged on the semiconductor chip 106 in a cross-cuppled manner and are connected to each other by the metal interconnection resistors 1803 and 1804. According to such a configuration, the metal interconnection resistor can be arranged without expanding the distance between the pads 1801 and 1802 and the protective elements 1805 and, 1806. In FIG. 18, since the distance between the pads 1801 and 1802 and the protective element protective elements 1805 and 1806 can be taken without expanding the distance in the vertical direction, it is possible to secure the resistance value of the metal interconnection resistors 1803 and 1804 by suppressing an increase in chip area.

Figure 19:
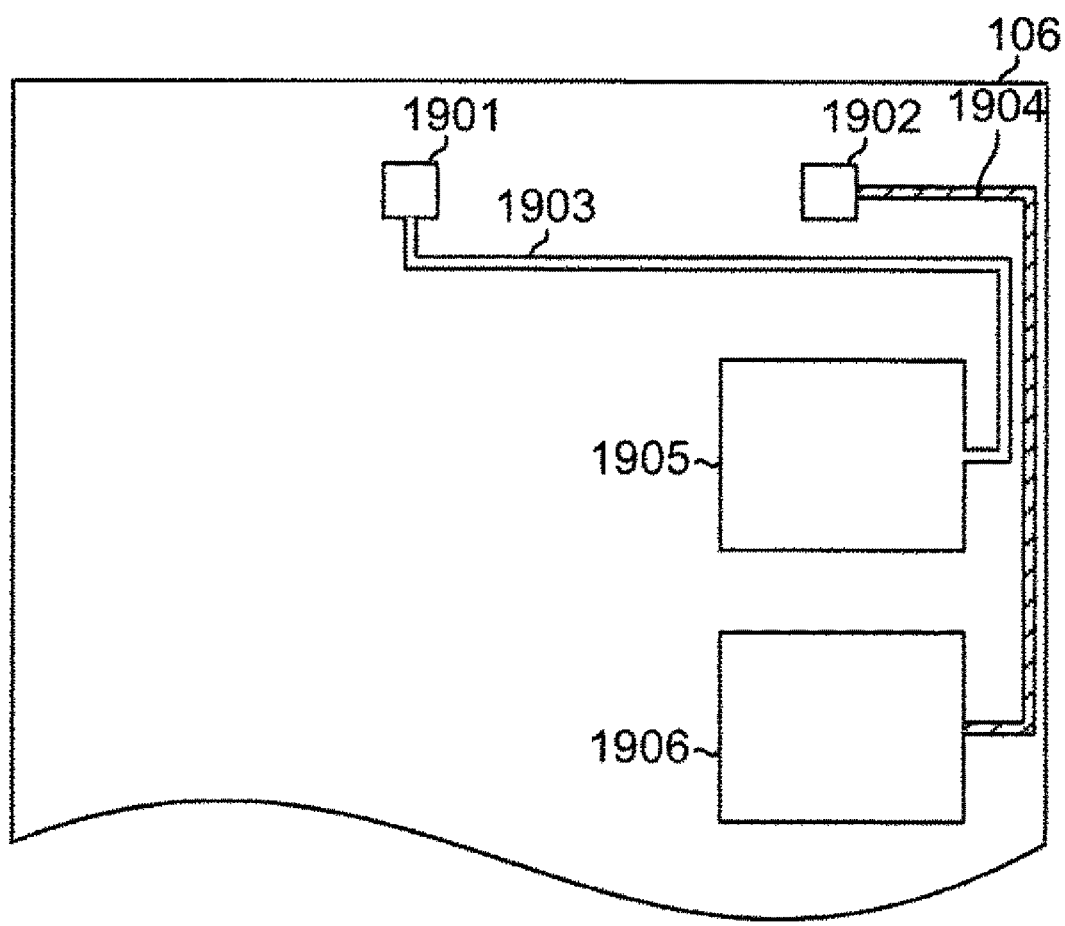
FIG. 19 is a top diagram of a semiconductor chip according to a ninth embodiment.
Figure 20:
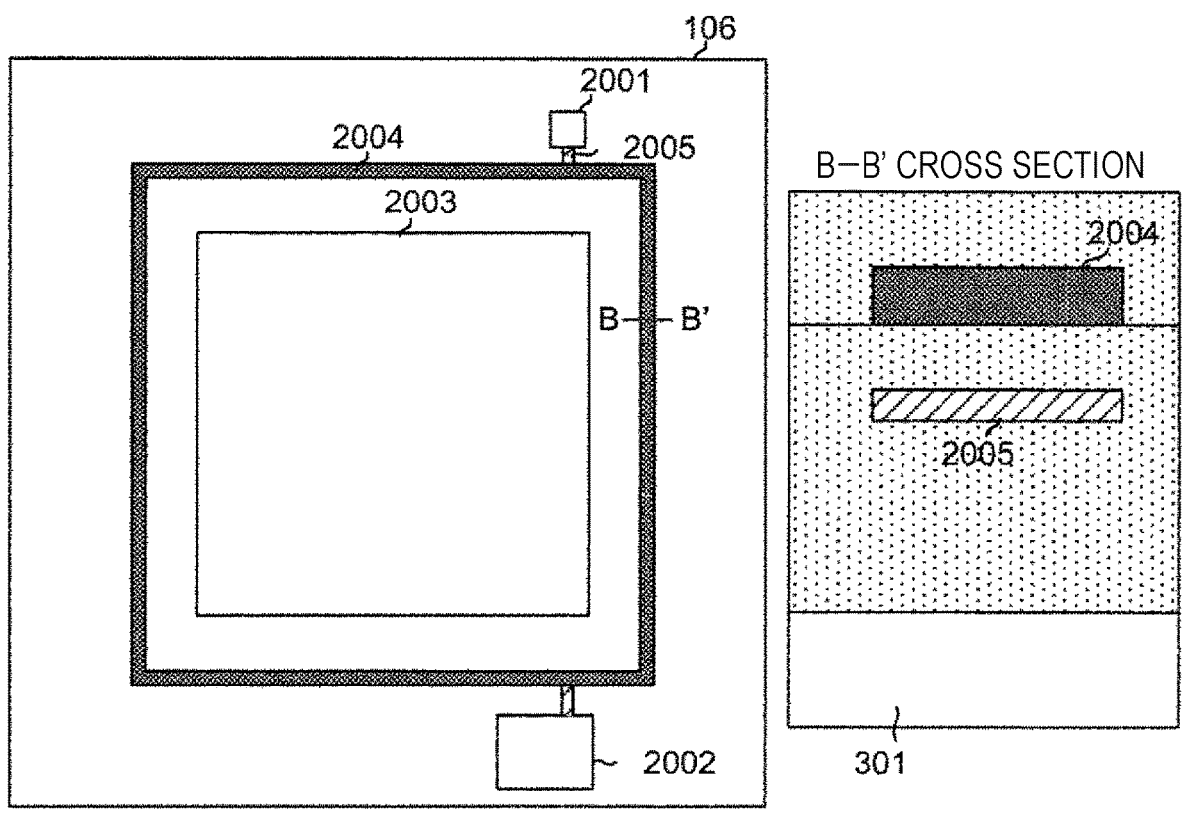
FIG. 20 is a diagram illustrating a modified example of the ninth embodiment.

A protective circuit of a semiconductor chip according to a ninth embodiment of the present invention will be described with reference to FIG. 19. FIG. 19 is a layout diagram of a plurality of pads 1901 and 1902, metal interconnection resistors 1903 and 1904, and protective elements 1905 and 1906 on the semiconductor chip 106 according to the ninth embodiment. The protective circuit according to the embodiment is characterized in that a plurality of the pads 1901 and 1902 and the protective elements 1905 and 1906 corresponding to the pads 1901 and 1902 are arranged on the semiconductor chip 106 along another side of the semiconductor chip 106, and a portion of the metal interconnection resistors 1904 is arranged along a marginal area on the outer periphery of the semiconductor chip 106. According to such a configuration, since the metal interconnection resistor 1904 can be arranged by utilizing the marginal area on the outer periphery of the semiconductor chip 106, the resistance value of the metal interconnection resistor 1904 can be secured by suppressing an increase in chip area. FIG. 20 is a modified example of the ninth embodiment, and the protective circuit is characterized in that a metal resistor interconnection 2005 connecting a pad 2001 and a protective element 2002 is arranged under a power supply ring 2004 surrounding an internal circuit region 2003. According to such a configuration, since it is unnecessary to secure a new region in order to arrange the metal interconnection resistor, it is possible to secure the resistance value of the metal interconnection resistor by suppressing an increase in chip area.

REFERENCE SIGNS LIST 100 pad
101 metal protective resistor
102 protective element
104 ground terminal
105 internal circuit
106 semiconductor chip
107 protective circuit
108 interconnection
301 substrate
302 diffusion layer
303 contact
304 metal interconnection layer
305 via
306 input end
307 output end
401 via
402 contact
403 diffusion layer
404 interconnection layer
405 straight line section
406 metal interconnection resistor
407 corner portion
501 metal interconnection resistor
502 via
503 contact
504 diffusion layer
601 metal interconnection
602 via
603 metal interconnection
604 interconnection
605 contact
606 diffusion layer
701 via
702 interconnection
703 contact
704 diffusion layer
705 metal interconnection layer
706 metal interconnection layer
801 polysilicon resistor
901 via
902 contact
903 contact
904 interconnection
905 contact
906 diffusion layer
1002 metal interconnection resistor
1003 metal interconnection resistor 1004 metal interconnection resistor
1005 protective capacitor
1006 protective capacitor
1101 electrode
1102 electrode
1103 diffusion layer
1104 interconnection
1105 via
1106 contact
1201 ggNMOS
1301 varistor
1400 sensor device
1401 power supply terminal
1402 output terminal
1403 ground terminal
1404 metal protective resistor
1405 metal protective resistor
1406 protective element
1407 protective element
1408 internal circuit
1409 semiconductor chip
1410 power supply pad
1411 output pad
1412 ground pad
1501 thin film
1502 interlayer insulating film
1601 a structure in which a plurality of metal interconnection layers are connected by vias
1702 metal interconnection layer
1703 metal interconnection layer
1704 metal interconnection layer
1705 via
1706 via
1801 pad
1802 pad
1803 metal interconnection resistor
1804 metal interconnection resistor
1805 protective element
1806 protective element
1901 pad
1902 pad
1903 metal interconnection resistor
1904 metal interconnection resistor
1905 protective element
1906 protective element
2001 pad
2002 protective element
2003 internal circuit region
2004 power supply ring
2005 metal interconnection resistor
2101 transistor
2102 parasitic diode
2201 PMOS
Rm resistance value
Id current
Vd voltage
Rd resistance value
$V_N$ noise voltage
$V_{CC}$ power supply
Out output
Gnd ground
$V_{BD}$ breakdown voltage

The invention claimed is:
1. A semiconductor chip comprising:
a pad;
a protective element protecting an internal circuit; and
a metal interconnection for electrically connecting the pad and the protective element,
wherein the metal interconnection includes a high resistance portion having a resistance value higher than a resistance value of the protective element, and
the protective element is adjacent to a silicon substrate, and a distance between the high resistance portion and the substrate is 500 nanometers or more.

2. The semiconductor chip according to claim 1, wherein the high resistance portion includes a metal thin film layer disposed in a same layer as the pad.

3. The semiconductor chip according to claim 1, wherein the high resistance portion includes a metal thin film layer disposed below the pad and a via connecting the metal thin film layer and the pad.

4. The semiconductor chip according to claim 2, wherein the metal thin film layer includes a portion having a spiral shape.

5. The semiconductor chip according to claim 4, wherein the metal thin film layer at least two bent angles of 45 degrees in the portion having the spiral shape.

6. The semiconductor chip according to claim 1, wherein the high resistance portion includes a first metal thin film layer disposed in a same layer as the pad, a second metal thin film layer disposed below the first metal thin film layer, and a via connecting the first metal thin film layer and the second metal thin film layer.

7. The semiconductor chip according to claim 6, wherein the first metal thin film layer and the second metal thin film layer are connected in series by the via.

8. The semiconductor chip according to claim 1, further comprising a polysilicon resistor formed on a field oxide film,
wherein one end side of the polysilicon resistor is connected to the high resistance portion through a first contact, and the other end side is connected to the protective element through a second contact and a metal thin film layer.

9. The semiconductor chip according to claim 2, further comprising a first electrode and a second electrode which are disposed in the same layer as the metal thin film layer and disposed so as to extend in parallel with the metal interconnection,
wherein the first electrode and the second electrode are connected to a power supply potential, and
wherein capacitors are disposed between the first electrode and the metal thin film layer and between the second electrode and the metal thin film layer.

10. The semiconductor chip according to claim 9, further comprising:
a third electrode disposed above the metal thin film and connected to the first electrode and the second electrode through vias; and
a fourth electrode disposed below the metal thin film and connected to the first electrode and the second electrode through vias,
wherein the first to fourth metal electrodes are disposed so as to stereoscopically surround the metal thin film layer, and
wherein a capacitor is disposed between the first to fourth metal electrodes and the metal thin film layer.

11. The semiconductor chip according to claim 2, wherein a layer having a thermal resistance lower than a thermal resistance of an interlayer insulating film is provided in the interlayer insulating film between the metal thin film layer and a semiconductor substrate.

12. The semiconductor chip further according to claim 1 comprising a power supply ring arranged so as to surround the internal circuit,
wherein the high resistance portion is arranged in the power supply ring region.

13. The semiconductor chip according to claim 1,
wherein the pad includes a first pad and a second pad,
wherein the protective element includes a first protective element and a second protective element,
wherein, the metal interconnection includes:
a first metal interconnection disposed on an electrical path between the first pad and the first protective element; and
a second metal interconnection disposed on an electrical path between the second pad and the second protective element,
wherein the first metal interconnection includes a first high resistance portion having a resistance value higher than a resistance value of the first protective element,
wherein the second metal interconnection includes a second high resistance portion having a resistance value higher than a resistance value of the second protective element, and
wherein the first pad, the first protective element, the second pad, and the second protective element are arranged in a cross-coupled manner.

14. The semiconductor chip according to claim 1,
wherein the pad includes a first pad and a second pad,
wherein the protective element includes a first protective element and a second protective element,
wherein the metal interconnection includes:
a first metal interconnection disposed on an electrical path between the first pad and the first protective element; and
a second metal interconnection disposed on an electrical path between the second pad and the second protective element,
wherein the first metal interconnection includes a first high resistance portion having a resistance value higher than a resistance value of the first protective element,
wherein the second metal interconnection includes a second high resistance portion having a resistance value higher than a resistance value of the second protective element,
wherein the first pad and the second pad are arranged along a first side of the semiconductor chip, and
wherein the first protective element and the second protective element are arranged along a second side of the semiconductor chip.

15. The semiconductor chip according to claim 1, wherein the high resistance portion of the metal interconnect includes a metal protective resistor that include a portion having a zigzag shape.

16. The semiconductor chip according to claim 1, further comprising a polysilicon resistor formed on a field oxide film having a thickness, wherein a distance between the high resistance portion and the silicon substrate is larger than the thickness of the field oxide film.

17. A semiconductor chip comprising:
a pad;
a protective element protecting an internal circuit;
a metal interconnection for electrically connecting the pad and the protective element, wherein the metal interconnection includes a high resistance portion having a resistance value higher than a resistance value of the protective element, and the high resistance portion includes a metal thin film layer disposed in a same layer as the pad; and
a first electrode and a second electrode which are disposed in the same layer as the metal thin film layer and disposed so as to extend in parallel with the metal interconnection, wherein:
the first electrode and the second electrode are connected to a power supply potential, and
capacitors are disposed between the first electrode and the metal thin film layer and between the second electrode and the metal thin film layer.

18. A semiconductor chip comprising:
a pad;
a protective element protecting an internal circuit; and
a metal interconnection for electrically connecting the pad and the protective element,
wherein the metal interconnection includes a high resistance portion having a resistance value higher than a resistance value of the protective element,
the high resistance portion includes a metal thin film layer disposed in a same layer as the pad, and
a layer having a thermal resistance lower than a thermal resistance of an interlayer insulating film is provided in the interlayer insulating film between the metal thin film layer and a semiconductor substrate.

19. A semiconductor chip comprising:
a pad;
a protective element protecting an internal circuit; and
a metal interconnection for electrically connecting the pad and the protective element, wherein:
the metal interconnection includes a high resistance portion having a resistance value higher than a resistance value of the protective element,
the pad includes a first pad and a second pad,
the protective element includes a first protective element and a second protective element,
the metal interconnection includes:
a first metal interconnection disposed on an electrical path between the first pad and the first protective element; and
a second metal interconnection disposed on an electrical path between the second pad and the second protective element,
the first metal interconnection includes a first high resistance portion having a resistance value higher than a resistance value of the first protective element,
the second metal interconnection includes a second high resistance portion having a resistance value higher than a resistance value of the second protective element, and
the first pad, the first protective element, the second pad, and the second protective element are arranged in a cross-coupled manner.

20. A semiconductor chip comprising:
a pad;
a protective element protecting an internal circuit; and
a metal interconnection for electrically connecting the pad and the protective element, wherein:
the metal interconnection includes a high resistance portion having a resistance value higher than a resistance value of the protective element,
the pad includes a first pad and a second pad,
the protective element includes a first protective element and a second protective element,
the metal interconnection includes:

a first metal interconnection disposed on an electrical path between the first pad and the first protective element; and a second metal interconnection disposed on an electrical path between the second pad and the second protective element, the first metal interconnection includes a first high resistance portion having a resistance value higher than a resistance value of the first protective element, the second metal interconnection includes a second high resistance portion having a resistance value higher than a resistance value of the second protective element, the first pad and the second pad are arranged along a first side of the semiconductor chip, and the first protective element and the second protective element are arranged along a second side of the semiconductor chip.

* * * * *